United States Patent [19]

Palencher

[11] Patent Number: 4,977,369
[45] Date of Patent: Dec. 11, 1990

[54] FERROMAGNETIC MEASURING APPARATUS

[75] Inventor: Jacques Palencher, Troyes, France

[73] Assignee: Radio Controle, S.A., Lyons, France

[21] Appl. No.: 296,548

[22] Filed: Jan. 12, 1989

[30] Foreign Application Priority Data

Jan. 12, 1988 [FR] France ................................. 8800261

[51] Int. Cl.$^5$ .............................................. G01R 1/04
[52] U.S. Cl. ............................... 324/154 PB; 324/147
[58] Field of Search ............. 324/154 PB, 154 R, 149, 324/150, 155, 157, 146, 147

[56] References Cited

U.S. PATENT DOCUMENTS

| 2,734,108 | 2/1956 | Huber | 324/147 |
| 2,865,001 | 12/1958 | Millar | 324/147 |
| 2,908,867 | 10/1959 | Faus | 324/147 |
| 3,585,501 | 6/1971 | Okada et al. | 324/147 |

Primary Examiner—Reinhard J. Eisenzopf
Assistant Examiner—Robert W. Mueller
Attorney, Agent, or Firm—Helfgott & Karas

[57] ABSTRACT

A ferromagnetic measuring apparatus comprising a shaft on which is fixed a needle displaceable over a dial, and a first metallic plate. The shaft is pivotally mounted at its ends, in bearings, within the housing of a coil body, for displacement relative to a second metallic plate fixed within the housing. One of the end bearings is provided at one of the ends of the housing of the coil body while the other bearing is provided in a cap positioned on the housing of the coil body, at the other end thereof. A spiral spring is also provided, which is connected with the needle shaft. The spiral spring is fixed at its inner end to the cap and at its outer end to the needle which is rigid with the shaft.

7 Claims, 2 Drawing Sheets

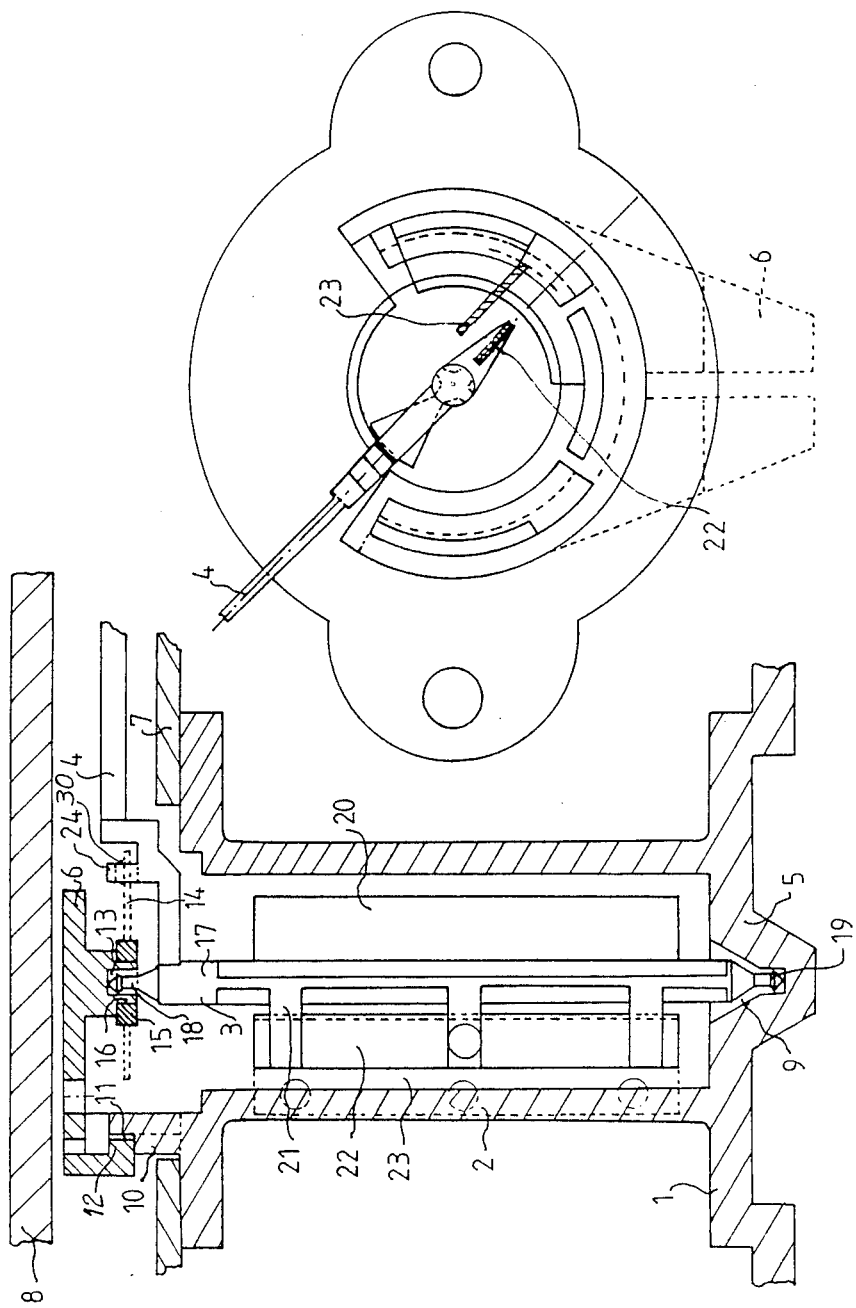

FERROMAGNETIC MEASURING APPARATUS

BACKGROUND OF THE INVENTION

The invention concerns a ferromagnetic measuring apparatus.

The measuring apparatus of the present invention can be quickly and simply constructed and assembled, whilst leading to the provision of apparatus of high sensitivity and high precision.

Such known types of apparatus include a very large number of parts which are manufactured independently from one another and which then have to be assembled to form sub-assemblies, these sub-assemblies then being assembled together to form the measuring apparatus.

SUMMARY OF THE INVENTION

According to the present invention, it is thus intended to provide a particular arrangement of these different parts into sub-assemblies which permit simple formation in one piece by moulding from a plastics material. The number of parts or sub-assemblies thus formed can then be rapidly and simply assembled together without special tooling, so as to form the measuring apparatus.

The present invention concerns ferromagnetic measuring apparatus including a shaft on which is fixed a needle movable over a dial and a first metallic plate, this shaft being pivotally mounted, on bearings at its ends, inside a housing of a coil body for displacement relative to a second metallic plate fixed inside this housing, one of the end bearings being provided at one of the ends of the coil body housing, the other bearing being provided on a cap fixedly attached to the coil body, at the other end of the housing, a spiral spring also connected to the needle shaft, the measuring apparatus being characterised in that the spiral spring is fixed at its central end to the cap and at its outer end to the shaft which is rigid with the needle.

According to another characteristic of the invention, the cap has an axial bearing surface which forms a bearing for the pivotal movement of one of the ends of the shaft, this axial bearing surface forming the support for the central end of the spiral.

In accordance with another characteristic of the invention, the outer end of the spiral is fixed to the needle.

The invention is shown by way of non-limiting example in the attached drawings.

BRIEF DESCRIPTION OF THE DRAWINGS

FIG. 1 is a partial axial section of apparatus in accordance with the invention, FIG. 2 is a view of FIG. 1 from above.

DETAILED DESCRIPTION OF THE PREFERRED EMBODIMENT

Figure 3:
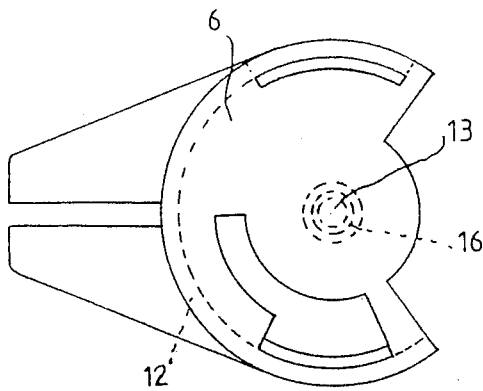
FIG. 3 is a view of the cap from above.
Figure 4:
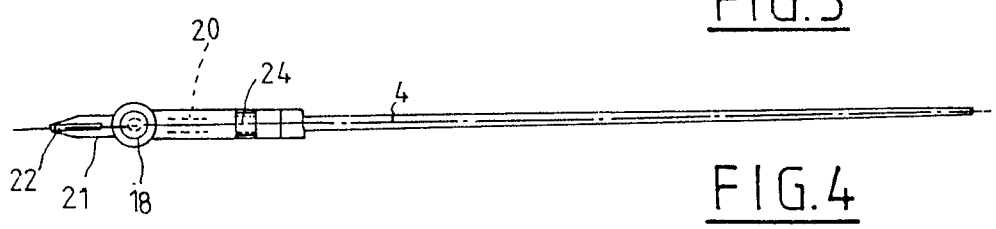
FIG. 4 is a view of the displaceable equipment of the device from above.
Figure 5:
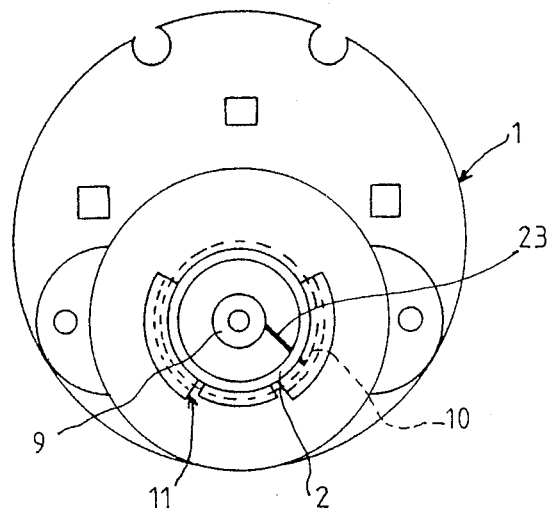
FIG. 5 is a view of the coil-body from above.

The apparatus shown in the drawings comprises a coil-body 1 on which is formed the coil of the ferromagnetic apparatus. The column-shaped part 2 of this body is formed hollow and houses the displaceable equipment 3 which carries the indicator needle 4. This displaceable equipment is pivotally mounted, both on the base 5 of the hollow column 2, and also on a cap 6 pivotally mounted on the body 2 of the coil. This apparatus is completed by a dial 7 and by a transparent glass 8.

The body 1 of the coil, with its column part 2, is formed by moulding from a plastics material in a single piece together with the base 5 of the hollow part of the column 2, and the moulding of this base 5 includes the pivot housing 9 for the pivotal mounting of one end of the displaceable equipment 3.

The opposite end of the column part 2 has an extension 10, which is also moulded integral with the coil-body, this extension 10 being of circular form and including sections which have been cut away in order to receive pivotally, within a groove 11, the cap 6. The cap 6 (see especially FIGS. 1 and 3) is provided with an internal circular rim 12 which is also partially cut away to permit the location of the cap 6 on the coil body 1, first by an axial displacement to arrange angularly the cut-outs of the rim 12 and the cut-outs of the extension 10 then, by a rotational movement through one-quarter turn, which causes the rim 12 to enter the groove 11.

This cap 6 is also formed in one piece by moulding from a plastics material and includes, as a result of the moulding operation, the bearing socket 13 which pivotally receives the upper part of the displaceable equipment 3.

The spiral spring 14 of the apparatus is mounted, by its internal end, on a ferrule 15 which fits onto a corresponding bearing surface formed on the cap 6 and surrounding the bearing socket 13.

The displaceable equipment is also formed by one piece moulding from a plastics material, and includes a shaft 17 ending at upper and lower pivotal points 18 and 19 respectively, this shaft being formed integral with the indicator needle 4 and with a damper plate 20 disposed radially parallel to the shaft 17.

The shaft 17 also includes tabs 21 which hold the metallic plate 22, this plate being intended to co-operate with the plate 23 provided inside the column part 2 of the coil-body, so as to bring about the displacement of the displaceable equipment as a function of the size of the electric current flowing through the coil.

The plates 22 and 23 are preferably fixed to the tabs 21 of the displaceable equipment 3, as well as to the inside of the column part 2 of the coil body 1 by moulding in, so as to position them directly at the time of production by moulding of these two parts.

The plate 20, radially orientated, is also intended to co-operate with the plate 23 of the column part of the coil, so as to form a damper element operating by compression of the air between these plates 20 and 23 when the displaceable equipment 3 pivots suddenly and when this plate 22 approaches plate 23.

This plate of plastics material 23, obtained directly by moulding of the displaceable equipment 3, is also of predetermined dimensions and position, so as to counterbalance the weight of the displaceable metallic plate 22, so that the displaceable equipment will be balanced.

The needle 4 of this displaceable equipment 3 is provided with a stud 24 arranged parallel to the shaft 17. The external end of the spiral spring 14 is provided with a belt 30 of which the diameter corresponds to that of the stud 24 in such a way that the external end of the spiral spring 14 can be connected to the needle 4 simply by placing this belt 30 over the stud 24 which is situated in the plane of the spiral spring 14. Preferably, the free end of this stud 24 is provided with a zone of enlarged diameter so as to retain the belt 30 of the spring.

It is to be noted that the ferromagnetic measuring apparatus of the invention consists essentially of three parts which have been obtained by moulding from a plastics material, the first of these parts forming the coil body 1 with one of the sockets which pivotally holds the displaceable equipment, the second part forming the cap adapted to pivot on the coil body and holding the spiral spring 14 so as to form a sub-assembly with it, and the third part being formed by the displaceable equipment 3 comprising in a single piece the pivot shaft 17 with its pivotal points, the needle 14 and the damping and balancing plate 20.

At the time of assembly of the apparatus, it is therefore necessary only to introduce the displaceable equipment into the hollow part of the column part of the coil-body and to put in place the cap 6 provided with the spiral 14, the outer end of the spiral then being capable of being rapidly positioned on the stud 24.

I claim:

1. A ferromagnetic measuring apparatus comprising a coil body including a housing with an exciting coil thereon; a needle; a dial; a shaft fixed to said needle adapted to displace relative to said dial; a first metallic plate connected to said shaft; a second metallic plate provided on said housing and fixed therewithin; bearing means for pivotally supporting said shaft in said housing for displacement of said shaft with said first metallic plate relative to said second metallic plate in dependence on an amount of electric current flowing through said coil; a cap mounted at one end of said housing, said bearing means including a first bearing formed in the other end of said housing and receiving one end of said shaft and a second bearing formed in said cap and receiving another opposite end of said shaft; and a spiral spring having an inner end fixed to said cap and an outer end connected to said needle.

2. Apparatus according to claim 1, wherein said cap has an axial bearing surface which forms said second bearing supporting said another end of said shaft for pivotal movement.

3. Apparatus according to claim 2, wherein said cap is a one-piece ring-shaped element having an inner rim inserted in a groove provided in said housing.

4. Apparatus according to claim 2, wherein said needle and said shaft is formed of one piece.

5. Apparatus according to claim 4, further comprising a counterweight for balancing the weight of said first metallic plate and positioned in said housing.

6. Apparatus according to claim 5, wherein said counterweight is formed of one piece with said shaft and said needle.

7. Apparatus according to claim 6, wherein said counterweight is formed as a radial plate cooperating with said second metallic plate to form a damping device.

* * * * *